United States Patent [19]
Vergano et al.

[11] 3,928,096

[45] Dec. 23, 1975

[54] BORON DOPING OF SEMICONDUCTORS

[75] Inventors: Peter J. Vergano, Toledo, Ohio; William E. Smith, deceased, late of Toledo, Ohio, by Frederick L. Smith, administrator

[73] Assignee: Owens-Illinois, Inc., Toledo, Ohio

[22] Filed: Jan. 7, 1974

[21] Appl. No.: 431,211

[52] U.S. Cl. ................ 148/189; 148/186; 148/187; 252/951

[51] Int. Cl.² ............................................ H01L 7/44

[58] Field of Search ........... 148/189, 188, 186, 187; 106/39.6, 39.7, 54, 52; 65/33; 252/951

[56] References Cited

UNITED STATES PATENTS

| | | | |
|---|---|---|---|
| 3,022,179 | 2/1962 | Morrissey | 106/39.7 |
| 3,117,881 | 1/1964 | Henry et al. | 106/39.7 X |
| 3,374,125 | 3/1968 | Goldsmith | 148/189 |
| 3,518,510 | 6/1970 | Lamming | 148/188 X |
| 3,530,016 | 9/1970 | Joseph | 148/189 |
| 3,540,895 | 11/1970 | Scheidler et al. | 106/39.6 |
| 3,540,951 | 11/1970 | Pammer et al. | 148/189 |
| 3,640,093 | 2/1972 | Levene et al. | 106/50 |
| 3,841,927 | 10/1974 | Florence et al. | 148/189 |

*Primary Examiner*—G. Ozaki
*Attorney, Agent, or Firm*—Howard G. Bruss, Jr.; E. J. Holler

[57] ABSTRACT

Disclosed is a method for diffusion doping of silicon and germanium semiconductors by the vapor phase transport of $B_2O_3$ from a solid $B_2O_3$ source to the silicon semiconductor, wherein the solid $B_2O_3$ source comprises a rigid, dimensionally stable, glass-ceramic body containing at least about 10 mole percent of $B_2O_3$ in the glassy phase, the crystalline phase, or both.

12 Claims, 3 Drawing Figures

BORON DOPING OF SEMICONDUCTORS

The present invention relates to diffused-junction type semiconductor devices, and especially to a new method for diffusing boron into silicon and germanium semiconductors. More particularly, the present invention pertains to a precise and readily controllable method for diffusing a boron-containing layer in at least a portion of the surface of a silicon or germanium semiconductor for the purpose of forming a semiconductor junction therein.

Semiconductors have been known in the industry for many years, and the term semiconductor element has been considered generic to silicon, germanium and silicon-germanium alloys. As used herein, the term "semiconductor" is intended to mean such silicon, germanium and silicon-germanium alloy semiconductor elements. Such elements can be circular, rectangular or triangular or any other convenient geometric shape, although they are usually in the form of a wafer or disc in most commercial situations.

Such silicon semiconductors have an active impurity incorporated therein during manufacture or later by diffusion, which impurity affects the electrical rectification characteristics of the semiconductor as distinguished from other impurties which may have no appreciable effect on those characteristics. Active impurities are usually classified as donor impurities or acceptor impurties. The donor impurities include phosphorus, arsenic and antimony and the acceptor impurities include boron, gallium, aluminum and indium. In other cases, the silicon semiconductors are essentially free of such impurities and are called "intrinsic" semiconductors.

With respect to the nomenclature used in the semiconductor art, a zone of semiconductor material containing an excess of donor impurities and yielding an excess of free electrons is said to exhibit N type conductivity. On the other hand, P type conductivity is exhibited by a zone containing an excess of acceptor impurities resulting in a deficit of electrons or an excess of "holes". In other words, N type conduction is characterized by electron conduction whereas a P type conduction is one characterized by hole conduction. Intrinsic (sometimes called I type) silicon semiconductors contain neither donor or acceptor impurities.

When a continuous solid specimen of semiconductor material has an N type zone adjacent to P type zone, the boundary between them is termed a P-N or N-P junction and the specimen of semiconductor material is termed a P-N junction semiconductor device. When a zone of P type conductivity is adjacent a zone of greater P type conductivity, the junction is called a $P\text{-}P^+$ junction. When a zone of N type conductivity is adjacent a zone of greater N type conductivity, the junction is called an $N\text{-}N^+$ junction. Semiconductor junctions of the P-I type and N-I type also exist. The present invention encompasses the diffusion doping of boron to form P (including "$P^+$") zones in the above types of semiconductor devices.

Semiconductors have application and utility for purpose such as rectifiers, transistors, photodiodes, solar batteries, semiconductor controlled rectifiers and other devices. In addiiton to general electronic applications, the P-N junction semiconductor is frequently used as a radiation detector or charged particle detector.

Various developments have taken place in the prior art to effect the doping of the semiconductor material by the addition of dopant impurities while the silicon crystal is being pulled from a melt or by applying alloying and diffusing methods to a growing crystal. In general, the diffusion of the doping substance into the silicon material is effected by heating a predetermined quantity of the particular dopant together with the silicon so that the dopant atoms will permeate from all sides into the semiconductor body. Commonly assigned, copending application entitled "Method of Forming P-N Junction on Semiconductors", Ser. No. 305,548 filed Nov. 10, 1972 to W. E. Smith et.al. discloses a method of phosphorus doping of silicon.

Methods involving deposition of a dopant on a limited surface area of the semiconductor body are described in U.S. Pat. No. 3,287,187. This prior art method requires the deposition of an oxide of the semiconductor material by vapor deposition followed by diffusion of the doping substance into the semiconductor surface area by heating the semiconductor body.

Semiconductor devices containing a diffused P-N junction have been made by heating N type silicon semiconductors in the presence of a decomposable gaseous boron compound such as disclosed in U.S. Pat. Nos. 3,542,609; 2,804,405 and 3,524,776. The boron is believed to form a glassy film over the surface of the semiconductor and subsequently, with continued heating, a species of boron diffuses into the silicon. The prior art also envisions the deposition of a boron compound on the surface of the silicon semiconductor at a low temperaturue and then heated to a temperature at which diffusion will take place. Other techniques for diffusion deposition of boron include the deposition of vaporous $B_2O_3$ from fused boric oxide as in U.S. Pat. Nos. 3,041,214; 2,794,846; and 3,493,355.

More recently the use of oxidized boron nitride wafers as a source of boron in the doping of silicon semiconductors has been proposed in the article entitled "Boron Nitride as a diffusion Source for Silicon" by N. Goldsmith et al., appearing in the RCA Review of June 1967 at page 344. The Thesis entitled "The Use of 93% Boron Nitride Hot Pressed Wafers as a Boron Diffused Source for Silicon Solid State Diffusion", submitted by David B. Rupprecht to the Department of Electrical Engineering of the Graduate School of the University of Pennsylvania in June 1972, concerns a related technique. Also of interest is the article entitled, "Oxidized Boron Nitride Wafers as an In-Situ Boron Dopant Source for Silicon Diffusion" by D. Rupprecht and J. Stack appearing in the September 1973 issue of Journal of Electrochem. Soc.; Solid State Science and Technology. In this boron nitride technique, the boron nitride is oxidized in an oxidizing atmosphere prior to use as a diffusion source. This provides a $B_2O_3$ layer on the boron nitride surface which later decomposes and provides boron for the diffusion process. This process is limited in that the thickness of the $B_2O_3$ layer determines the amount of boron available for diffusion and, if an insufficient amount is present, then the solid solubility limit is not reached and controlling of the uniformity of the diffusion process is very difficult. Accordingly, in practicing this prior art process, close control over the boron nitride oxidization step is quite critical.

All of these prior art techniques are burdened with complex process features which increase the cost of semiconductor production.

Accordingly, it is an object of the present invention to provide a method for uniformly diffusing boron into a silicon semiconductor surface.

It is a further object of the invention to provide a novel solid source or host for the boron used for diffusion into the semiconductor surface.

It is a further object of the present invention to provide a method utilizing a $B_2O_3$-containing glass-ceramic body as the dopant source or host for the controlled application of $B_2O_3$ vapors to a surface of a silicon semiconductor element.

A still further object of the present invention is to provide a solid source capable of liberating $B_2O_3$ vapors that can be used repeatedly for the controlled and uniform doping a semiconductor surface.

The above and other objects and advantages of the present invention will become apparent from the following detailed description thereof taken in conjunction with the drawing wherein.

Figure 1:
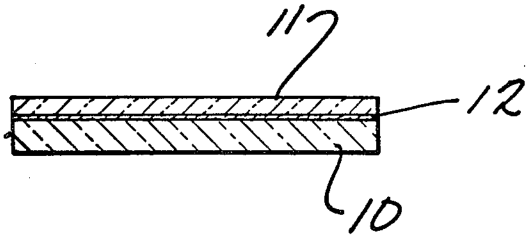
FIG. 1 is a cross-sectional view of the semiconductor body, having been processed in accordance with the method described herein.

The present invention overcomes the difficulties of the prior art methods by utilizing a rigid, dimensionally stable, substantially alkali metal oxide free glass-ceramic body containing at least about 10 mole percent $B_3$ $O_3$as a dopant source or host for vapor phase transport of $B_2O_3$ to the semiconductor. According to the present invention, the $B_2O_3$-containing glass-ceramic dopant host is maintained in vapor phase communication (with or without the presence of a carrier gas) with a semiconductor at a temperature and for a time sufficient to transport $B_2O_3$ from the dopant host to the surface of the semiconductor. The semiconductor so treated is then heated, with or without the continued presence of the glass-ceramic dopant for a time sufficient to permit diffusion of boron into the semiconductor to the desired depth.

A commercially significant embodiment of the invention is an N type silicon semiconductor which has formed therein a boron-containing layer defining a P type zone. The reverse side of the silicon chip or wafer retains its N type nature and, accordingly, the product produced by this invention is a P-N junction semiconductor device.

The invention is described in terms of the "vapor phase transport of $B_2O_3$" for lack of a clear understanding of the boron-containing species vaporized from the glass-ceramic host. Accordingly, this term includes whatever boron-containing species is responsible for the transport effect. Similarly, the diffusion process is discussed in terms of "boron diffusion" into the semiconductor for lack of a clear understanding of the boron-containing species actually being diffused. Accordingly, this term includes whatever boron-containing species is responsible for the diffusion doping effect.

Boron is deposited from the vapor phase onto the surface of the semiconductor and diffuses to a controlled depth within the silicon wafer. The concentration and depth of the junction is proportional to the time and temperature of the doping and diffusing process.

The composition of the $B_2O_3$-containing glass-ceramic dopant host is critical in that it must contain sufficient $B_2O_3$ to provide a vapor phase enriched in $B_2O_3$ at commercial doping temperatures in the range of about 700°C. to about 1200°C. It has been found that the glass ceramic dopant host must contain at least about 10 mole % of $B_2O_3$ to provide sufficient $B_2O_3$ vapors with the lower mole percentage of $B_2O_3$ requiring the higher temperature. Furthermore, the glass-ceramic dopant must be rigid and dimensionally stable at the doping temperatures so that deformation is not a problem when the dopant source is planar in configuration. In planar diffusion doping, a planar surface of a solid dopant host and a planar surface of the semiconductor to be doped are positioned parallel in spaced confronting relationship during the diffusional heat treatment. In that the concentration of $B_2O_3$ on the surface of the semiconductor is a function of the distance between the planar surfaces, dimensional stability of the dopant host is of the utmost importance in achieving uniformity in boron distribution on the surface of the silicon semiconductor.

The glass-ceramic dopant hosts particularly useful for practicing the present invention are formed from certain magnesia alumino borosilicate glasses which are substantially free of alkali-oxide. By substantially alkali-free, it is meant that the glasses do not contain sufficient alkali oxides (e.g., $K_2O$, $Na_2O$, and $Li_2O$) to yield a vapor phase containing such oxides at the doping temperatures. It has been found that presence of such alkali oxides in the vapor phase contributes undesirable conductivity characteristics to the resulting semiconductor. In the usual practice of the present invention, the combined alkali oxides are less than about 0.5 mole % and preferably less than 0.1 mole % of the glass-ceramic dopant composition. Preferably the alkali oxides are absent altogether, although this is not always possible because batch materials often contain alkali oxides as impurities.

The term "glass-ceramic" body is used herein according to its conventional meaning and refers to a semicrystalline ceramic body which is composed of at least one crystalline phase randomly dispersed in a residual glassy phase or matrix. Such crystalline phase is formed by the in-situ thermal crystallization of a parent glass composition.

The heat treatment process for forming glass-ceramics from a parent glass usually include a nucleation stage at substantially the temperature of the annealing point (viscosity $10^{13}$ poises) of the parent glass, a development stage at a temperature below the fiber softening point of the parent glass (preferably at a viscosity in the range of $10^8$ to $10^{12}$ poises), and a crystallization stage (at a temperature preferably 150° to 300°F. above the fiber softening point of the parent glass (i.e., viscosity of $10^{7.65}$ poises).

Although the crystallization process itself is not the subject of the present invention, the following description is given in the interest of completeness of disclosure. The parent glass to be crystallized is heated to a temperature corresponding to a viscosity of about $10^{13}$ poises and maintained at this temperature long enough to permit the formation of submicroscopic crystals dispersed throughout a glassy matrix. This is commonly known as the nucleation. The time required for the nucleation period varies according to the composition and is typically from ¼ to 24 hours.

The glassy matrix containing the nucleated crystals is then heated to a temperature corresponding to a viscosity of approximately $10^8$ poises. This thermal condition is maintained for a sufficient time to permit partial crystallization to form a rigid, crystalline structure. The submicroscopic nuclei dispersed in the glassy matrix as a result of the nucleation phase act as growth centers for the rigid framework formed during this second or development stage of the heating cycle. The development stages varies with composition and is typically ¼ to 4 hours. The purpose of the development phase is to provide a rigid skeletal-crystal framework to support the remaining matrix when the temperature is raised to complete crystallization.

This glass-ceramic body is then formed by heating to a temperature of 150° to 300°F. above the temperature corresponding to the viscosity of $10^{7.65}$ poises of the parent glass. This temperature is maintained until the desired degree of crystallinity is obtained. The final crystallization phase of the heat treating cycle is typically ¼ to 4 hours.

In actual practice, it has been found that all three stages of the heating process can be accomplished by continuously advancing the temperature through regions of nucleation, development and crystallization. In many compositions of the present invention, it has been found that a "formal" development stage is not required because the time required to heat the article from the nucleation temperature to the crystallization temperature is sufficient. Additional details for forming glass-ceramic bodies are described in U.S. Pat. No. 3,117,881, the disclosure of which is incorporated by reference.

In practicing the present invention, the glass-ceramic dopant host is formed from a magnesia alumino borosilicate parent glass such as a $(MgO.Al_2O_3).B_2O_3$. $SiO_2$ glass which is substantially free of alkali metal oxides and consisting essentially of the following ingredients on a molar percent basis.

| Component | Broad Range Mole % | Preferred Range Mole % |
|---|---|---|
| $SiO_2$ | 2–50 | 5–30 |
| $Al_2O_3$ | 15–36 | 20–30 |
| $B_2O_3$ | 10–50 | 25–50 |
| MgO | 15–36 | 20–36 |

Usually the sum total of alkali metal oxides is less than about 0.5 mole % and preferably less than 0.1 mole % in the above compositions.

In addition to the above oxides the term "consisting essentially of" is intended to include minor proportions (i.e. up to about 10 mole %) of other than alkali oxides such as glass forming oxides, modifying oxides, nucleant oxides (e.g. $TiO_2$ and/or $ZrO_2$) and refining aids, when such ingredients are required to achieve specific chemical or physical properties.

The essential feature is that the alumino borosilicate glass-ceramic dopant host contained at least 10 mole % of $B_2O_3$ which can be present in the glassy phase, crystalline phase, or combination thereof.

In accordance with one embodiment of the present invention and with reference to the attached drawings, a suitable N type silicon substrate 10 is prepared by any of the known techniques of obtaining monocrystalline bodies of silicon. For example, a monocrystalline ingot can be formed of highly purified silicon. The ingot is cut into transverse slices and the slices are diced to form silicon wafers of the desired dimension. The surface of the substrate can be prepared by suitable cleaning and polishing. However, the polished and cleaned semiconductive silicon materials can be commercially purchased. Polishing or cleaning of the surface can be accomplished by mechanical means such as lapping or the like or by chemical means, such as etching which is well understood in the art and does not form a part of the present invention.

Furthermore, the N type silicon wafer can be part of a complex semiconductor device and already have one or more P-N junctions arranged in any geometric pattern therein. The only important feature is that at least a part of the exposed surface of the silicon wafer exhibit "N" type of conduction. Accordingly, the term N type silicon as used herein includes such complex semiconductor devices having alternating zones of P and N type conduction.

For conventionally grown crystals, the surface may be chemically polished with a suitable etchant; for example, a concentrated solution of three parts hydrofluoric acid, three parts acetic acid and five parts nitric acid, by volume. Alternatively, the surface may be prepared by lapping or etching with a hot solution of water containing about 10% sodium hydroxide at ambient temperature and up to about 90°C. These cleaning and etching operations function for the purpose of removing contaminants from the surface and to make the surface uniform with a high degree of smoothness. These preparatory operations are well understood in the art.

Formation of P-N junctions of the present invention have been found to occur to a desirable extent on N type silicon having a resistivity of about 10 ohm-centimeters. It is, of course, readily apparent that the precise size and nature of the wafer is not critical. For example, wafer conventionally used can be 1, 2, or 3 inches in diameter or even more. The thickness can range from 5 to 20 mils, although this can vary. Typical wafers are 8 to 10 mils thick. Likewise, the resistivity of suitable N type silicon starting materials ranges from about 0.0001 to about 100 ohm-centimeters.

Referring now to FIG. 1, an oxide layer 11 is grown on the surface of wafer 10 in accordance with this invention. The wafer is heated in the vapors of $B_2O_3$ so that a film or coating is formed over at least a portion of the surface of the wafer. A mask or protective covering can be utilized so as to develop any pattern as is understood in the art. The coating or film 11 is of glassy nature and contains boron in one form or another.

The temperature of this operation is such that simultaneously, some boron diffuses from the film or deposit 11 into the wafer 10 forming a thin boron diffused surface layer or region 12 adjacent the coating 11. The region 12 is a barrier or boundary formed at the interface between the boron diffused surface layer 11 and the N conductivity silicon 10. The juncture depth can vary, but in general, it is up to about 10 microns in thickness. The minimum thickness can vary and illustratively is about 0.1 micron.

Figure 2:
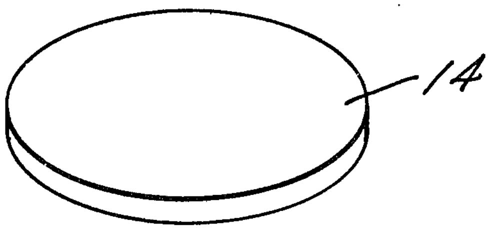
FIG. 2 is an isometric view of a solid $B_2O_3$-containing glass-ceramic dopant wafer as described herein.

FIG. 2 shows a disc or wafer of the $B_2O_3$-containing glass-ceramic dopant host, which functions as the source of $B_2O_3$ vapors for contact with the silicon wafers.

When positioned in a suitable furnace used for the invention, and when subjected to temperatures in the range of 700°C. to 1200°C., more particularly 850°C. to 1100°C., the glass-ceramic dopant wafer liberates $B_2O_3$ vapors, which vapors then flow through the furnace high temperature zone in the direction of contacting the silicon wafers positioned in the vicinity of the dopant wafer. Generally, the method comprises diffusing boron into a semiconductor silicon element by positioning at least one semiconductor silicon element in a furnace, positioning a solid dopant wafer, disc or similar body in the furnace in the vicinity of, but not in physical contact with the silicon element, and then subjecting the silicon element and glass-ceramic dopant to an elevated temperature in the range of 700°C. to 1200°C. At these temperatures the dopant liberates $B_2O_3$ vapors which vapors then pass through the furnace and contact at least a portion of the surface of the silicon element. This process is conducted for a sufficient period of time to permit the diffusion of the boron into at least one portion of the surface of the silicon element to form a diffused region therein. After the $B_2O_3$ vapors react with the hot silicon surface, the elemental boron diffuses into the silicon chip with continued heating. This boron diffusion step can be conducted in the absence of the glass-ceramic dopant wafer if desired.

As a further apsect of this embodiment of the invention, the doping process is further controlled and enhanced by the use of free-flowing inert carrier gas such as argon, or nitrogen. As used here, the expression "inert gas" means that the carrier gas does not enter into the chemical reaction between the $B_2O_3$ vapors and the hot silicon surface.

Figure 3:
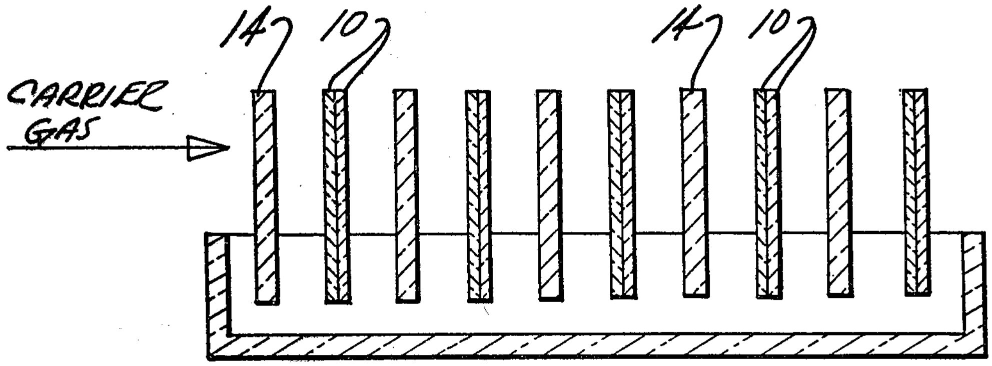
FIG. 3 is an elevation view showing a refractory container in which a plurality of solid wafers of the $B_2O_3$-containing glass-ceramic and a plurality of silicon wafers are arranged for practicing the present invention.

This is shown in FIG. 3, wherein the carrier gas enters from the left and passes across wafer 14 where the $B_2O_3$ is released and contacts the exposed surfaces of the silicon wafer 10. By placing two silicon wafers back-to-back, the reverse side of each of the silicon chips receives no boron from the process and consequently retains its original character as an N type silicon. Following the doping process, the diffusion depth can be further increased to diffuse the junction deeper by a simple heat treatmet in an inert atmosphere. This can be carried out in a separate furnace if desired. The process has been described in terms of silicon semiconductors because of their commercial importance, although the same process can be applied to germanium semiconductors although somewhat lower temperatures are employed for doping germanium because of its 937°C melting point.

In preparing the glass-ceramic dopants, suitable compositions containing appropriate raw materials can be melted to form a homogeneous glass. Illustratively, compositons described above can be melted to form a homgeneous glass at 1500°C. to 1650°C. in a refractory vessel. Generally, this melting procedure requires about 15 minutes to several hours to achieve homogeneity. It can be desirable to add additional $B_2O_3$ to the melt to account for losses due to volatilization. It is desirable to keep the melting time as short as possible in order to reduce the losses due to volatilization. Also, the batch material should be as pure as possible so as to minimize the presence of impurities.

The dopant host can be produced in a number of ways. The parent glass can be melted from metal organic derived materials to minimize the content of undesirable ingredients as disclosed in commonly assigned U.S. Pat. No. 3,640,093, the disclosure of which is incorporated by reference, or it can be melted from conventional high purity glassmaking ingredients.

The most important consideration is that the glass or the glass-ceramic be free of impurities which exhibit high vapor pressures at 900°C. to 1200°C. Clearly, the presence of impurities can deleteriously affect the electrical performance of the doped silicon semiconductor device. Impurities specifically to be excluded or held at an absolute minimum are the oxides of the alkalis, (i.e., $Li_2O$, $Na_2O$, $K_2O$, $Cs_2O$, or $Rb_2O$) and other high vapor pressure metal oxides such as PbO, CuO, and $SnO_2$.

After the glass compositions are melted and formed into a homogeneous molten mass, the glasses can be cast into any desired shape. Conveniently, this can be carried out by casting the glass into preheated graphite molds in the shape of right circular cylinders of a diameter approximating that of the finished diffusion disc. The glass can be permitted to cool and when cold the glass billet or cylinder is removed and inspected for flaws and then sliced into wafers usually ranging from 0.025 inches to 0.050 inches in thickness. At this point, the glass wafers are in a form for conversion to a glass-ceramic. Alternatively, the glass billet or a core drilled section can be heat treated to form the glass-ceramic which glass-ceramic is then sliced into wafers. Because of the very close control made possible by the present invention, a plurality of silicon elements can be treated by appropriate positioning of a plurality of glass-ceramic dopant wafers arranged in a boat as shown in FIG. 3.

In carrying out this aspect of the invention, the doping is accomplished by placing the glass-ceramic dopant chips near and parallel to, but not touching, the silicon wafer to be doped. Generally, for best results, the distance has been determined to be about one-eighth inch. In a multi-slotted fused silica boat or other refractory vessel, container or the like, as many as 100 or more silicon chips or wafers can be doped to a uniform level by alternately spacing a glass-ceramic wafer, and a pair of wafers in back-to-back contact with confronting faces, silicon wafers and glass-ceramic wafers, being substantially parallel. The general arrangement can be as shown in FIG. 3.

Time and temperature of doping conditions are selected to give the appropriate P-N junction depth and sheet resistivity for the desired device configuration. This is shown in the examples that follow.

Spacing of the chips in the boat and selection of ambient inert carrier gas and the flow rate are based on requirements that silicon chips facing in the direction of the ambient gas flow receive equivalent doping to those facing counter to the flow.

The invention will be further explained in the examples that follow wherein all percentages are in mole percentages and temperatures are in °C unless stated otherwise.

EXAMPLE 1

Part A

Preparation of Glass-Ceramic Dopant Composition

A stirred reaction vessel is charged with 1132 grams ethyl silicate, 750 ml ethanol, 60 ml water and 6 ml 1 N nitric acid. The mixture is stirred briefly and allowed to stand for several hours until the ethyl silicate has hydrolyzed.

A solution of 4495 grams of aluminum sec-butoxide in 500 ml of sec-butanol are slowly added, with stirring to the hydrolyzed ethyl silicate. The reaction is mildly exothermic and the rate of addition is regulated so as to maintain the temperature of the reaction mixture below about 50°C.

When the addition of the aluminum sec-butoxide is complete, 100 ml of water is added with continual stirring, followed by the addition of 2609 grams of trimethyl borate. The resulting mixture becomes quite gelatinous and is thinned by the addition of 4000 ml of water. After thinning, 368 grams of magnesium oxide is added in small increments with continuous stirring to obtain a uniform dispersion of the magnesium oxide throughout. The reaction mixture is then stirred for an additional 20 minutes.

The reaction mixture is poured into shallow, plastic trays which are then placed in a forced air oven maintained at 60°C. to evaporate the solvent therefrom. After evaporation of the volatile solvents, a fine white powder is obtained. The powder is dried at 150°C. for about 20 to 24 hours. About 2500 grams of dry powder is obtained.

The powder is transferred to a platinum crucible and melted at about 1540°C. for 5 hours with occasional manual stirring to form a clear, homogeneous glass having the mole % composition 15% $SiO_2$, 34.7% $B_2O_3$, 25.2% MgO, and 25.2% $Al_2O_3$.

Part B

Formation of the Glass-Ceramic Dopant Host

The molten glass from Part A is poured into preheated graphite mold having the shape of a right circular cylinder. The dimensions of the cylinder are 2¼ inches in diameter and 3 inches in length. The mold containing the glass is annealed at 671°C.

The annealing requires about ¼ to ½ hour. The molds are then permitted to cool and the glass cylinder is removed. The cylinders are then cut into wafers ranging from 15 to 40 mils in thickness.

The wafers are carefully stacked in a heat treatment furnace and the temperature raised to 845°C. to initiate in-situ thermal crystallization. The wafers are held at this temperature for 4 hours and the temperature is then raised to 867°C. where the wafers are held for 1 hour. Finally, the temperature of the heat treatment furnace is raised to 1100°C. The wafers are held at this last temperature for 1 hour after which the furnace is turned off and allowed to cool to room temperature overnight.

The resulting nonporous glass-ceramic wafers are removed and dessicated for use in $B_2O_3$ diffusion doping.

Part C

Planar Diffusion Doping

Planar diffusion doping is accomplished by placing some of the glass-ceramic wafers of Part B about one-fourth inch from, and a parallel confronting relationship to, the silicon wafers to be doped. The glass-ceramic wafers and silicon wafers are arranged in multi-slotted, fused silica trays by alternately spacing a glass-ceramic wafer, two silicon wafers back-to-back, a glass-ceramic wafer, and so on. The general assembly is as shown in FIG. 3.

The silicon wafers used in this example originally are N-type, and have a resistivity of about 9 ohm-cm.

The assembly is placed in a diffusion furnace and argon gas is passed therethrough as an inert carrier gas as shown in FIG. 3 at the rate of 500 cc/minute, while the temperature is maintained at about 1050°C. These conditions are maintained for one hour.

At the end of this diffusion doping period, the silicon wafer is cooled to room temperature and cleaned with dilute hydrofluoric acid.

The surface of the doped silicon wafers exhibit P-type conductivity. Surface testing of the doped wafers with a four-point conductivity probe and the surface resistivity is measured to be about 13 ohms/square. The P-N junction is estimated to be about 3 to 4 microns in depth from the surface of the silicon wafer. The dopant disc has not significantly slumped or otherwise deformed at the end of the diffusion doping process. When an N type germanium semiconductor is doped according to the present invention, somewhat lower doping temperatures must be employed because the melting point of germanium is 937°C.

Several more diffusion doping tests are conducted by the above procedure except that the time and temperature are varied as set forth below. In each case the doped silicon wafer exhibited P type conductivity.

Sheet Resistivity of P Doped Silicon Wafer (Ω/square)

| Temperature (°C) | Time (Hours) | | | |
|---|---|---|---|---|
| | ½ | 1 | 2 | 4 |
| 1000 | 48 | 42 | 30 | 25 |
| 1025 | 32 | 17 | 12 | 16 |
| 1040 | 26 | 20 | 14 | 10 |
| 1050 | 18 | 13 | 10 | 8 |

EXAMPLE 2

Part A

Preparation of Glass-Ceramic Dopant Host

High purity inorganic batch materials comprising reagent grade oxides and carbonates are blended to yield a 500 gram batch composed of 15.7 mole % $SiO_2$, 41.3 mole % $B_2O_3$, 21.5 mole % $Al_2O_3$ and 21.5 mole % MgO. The batch is placed in a platinum crucible and the crucible is then placed in a furnace maintained at 1540°C. The crucible is heated for about 6 hours with occasional stirring to form a molten, clear, homogeneous glass. The glass is removed from the furnace and solidified in an annealing oven maintained at 650°C. for about one-half hour.

Part B

The crucible is removed from the annealing oven, cooled, and cores having nominal diameters of 2¼ inches by 3 inches long are drilled from the solidified glass. The cores are then sliced into wafers having dimensions as described in Example 1, except the temperature and time schedule is 852°C. for 1 hour and the final temperature and time is 1100°C. for 1 hour before turning the furnace off and allowing the furnace to cool to room temperature at the furnace rate. The resulting glass-ceramic wafers are non-porous and dimensionally stable.

Part C

Planar Diffusion Doping

Planar diffusion doping is accomplished with the wafers of Part B as in Example 1 except that the temperature is 950°C and the argon flow rate and temperature are as set forth below. The data indicates the resistivity decreases with increased doping time. The change in resistivity is due to the increased P type doping.

Sheet Resistivity of P-Doped Silicon Wafers (Ω/square)

| Argon Flow Rate (cc/minute) | Time (Hours) ½ | 1 | 2 | 4 |
|---|---|---|---|---|
| 100 | 184 | 90 | 39 | 23 |
| 340 | 93 | 75 | 69 | 40 |
| 500 | 53 | 40 | 32 | 28 |
| 640 | 71 | 44 | 35 | 33 |

The reason for the 184 ohms/square reading at one-half hours and 100 cc/minute argon flow is not clear, although it is suspected that the conductivity may just be changing from N to P.

A further test is conducted as above except that the argon flow rate is 550 cc/minute and the spacing is one-eighth inch rather than one-fourth inch. P type doping is achieved in the doped silicon samples and the Ω/square are set forth below as a function of time.

| Time (Hours) | Ω/square |
|---|---|
| ½ | 57 |
| 1 | 47 |
| 2 | 37 |
| 4 | 31 |

EXAMPLE 3 – 9

Glass-ceramic dopant hosts are prepared from glasses of the composition as set forth in the following table. The procedure for melting and crystallizing the glasses is described in Part A of Example 2, except the temperatures are maintained as indicated in the table.

The crystallized glass-ceramics are removed from the crucible and sections thereof are prepared for planar diffusion doping.

The diffusion doping is accomplished by placing the dopant host in the bottom of a silica tray. An N type silicon wafer having a resistivity of about 5 ohm-cm is arranged in one of the slots of the silica tray, in a vertical position, and at a distance of about one half inch from the dopant host.

The silica tray assembly is placed in a diffusion furnace and argon gas is passed through as shown in FIG. 3, at a rate of 500 cc/minute while the temperature is maintained at 1000°C. These conditions are maintained for 1 hour for each run.

At the end of the diffusion doping period the silicon wafer is cooled to room temperature and observed visually. Interference patterns, indicating the presence of a thin film, are observed on all of the silicon wafers indicated in the following table. The surface of the silicon wafer is then cleaned with dilute hydrofluoric acid.

The surface conductivity of the silicon wafer is tested and all of the silicon wafers exhibit P type conductivity.

| Oxide | Mole % Ex. 3 | Ex. 4 | Ex. 5 | Ex. 6 | Ex. 7 | Ex. 8 | Ex. 9 |
|---|---|---|---|---|---|---|---|
| $SiO_2$ | 3.9 | 9.6 | 3.5 | 9.0 | 3.4 | 8.8 | 14.2 |
| $B_2O_3$ | 47.1 | 44.6 | 39.3 | 37.0 | 32.2 | 30.4 | 28.6 |
| MgO | 24.5 | 22.9 | 28.6 | 27.0 | 32.2 | 30.4 | 28.6 |
| $Al_2O_3$ | 24.5 | 22.9 | 28.6 | 27.0 | 32.2 | 30.4 | 28.6 |
| Batch Melting Temp. (°C) | 1538 | 1594 | 1538 | 1594 | 1538 | 1594 | 1538 |
| Crystallization Heat Treatment 4 hrs. | 690°C. | 821°C. | 700°C. | 710°C. | 720°C. | 837°C. | 840°C. |
| + 1 hr. | 835°C. | 865°C. | 820°C. | 845°C. | 865°C. | 865°C. | 895°C. |
| + 1 hr. | 1000°C. | 1000°C. | 1000°C. | 1000°C. | 1000°C. | 1000°C. | 1000°C. |

EXAMPLES 10–17

The following additional Examples further illustrate the principles of the present invention and present additional doping data as well as a qualitative indication of thermal stability of the glass-ceramic dopant hosts. Glass-ceramic dopant hosts are prepared from glasses of the compositions set forth in the following table. The glass quality is also noted in the table. The compositions that are clear vitreous glasses are designated as "good" and other compositions are observed to be opal. The procedures for melting and crystallizing the glasses is described in Part A and Part B of Example 2 except that the temperatures are maintained as indicated in the following table.

An arbitrary "Sag Test" is reported in the table below. In this test, glass bars approximately one-eighth inch square and about 1⅛ inch in length are prepared from the indicated glass and crystallized to a glass-ceramic body by the crystallization heat treatment indicated. After crystallization each glass-ceramic bar is ground to flatness on both sides so that the finished dimensions are 1⅛ inch × ⅛ inch × 1/16 inch. Each glass-ceramic bar is then placed across a platinum vessel ⅞ inch wide, (with ⅛ inch dimension of the bar resting on the vessel) and held at temperatures ranging from 1000° to 1250°C for ½ hour. The distance that the 1/16 inch thickness sagged or deflected from flatness gives an arbitrary indication of the resistance to thermal deformation. While the amount of thermal deformation or sagging that can be tolerated varies with sample thickness, doping time and doping temperature in any situation, a sagging of greater than about 0.3 mm in the above procedure approximately corresponds to the maximum allowable deformation for a very thin (e.g. about 20 mil thickness) doping wafer about 1–1½ inches in diameter in a doping assembly like that shown in FIG. 3. Thicker glass-ceramic dopant shapes can be employed for higher temperatures.

Planar diffusion doping is accomplished as in Part C of Example 1 except that the diffusion doping period is for one-half hour at the temperatures indicated in the table. The results of this doping are set forth in the table.

The data in the table indicates that the tendency for deformation increases with increasing temperatures although good thermal stability is observed for very thin glass-ceramic bars.

| Example No. | 10 | 11 | 12 | 13 | 14 | 15 | 16 | 17 |
|---|---|---|---|---|---|---|---|---|
| Mole% | | | | | | | | |
| $SiO_2$ | 36.0 | 24.0 | 33.4 | 25.0 | 35.0 | 30.0 | 30.0 | 37.6 |
| $B_2O_3$ | 24.0 | 36.0 | 14.8 | 40.0 | 35.0 | 35.0 | 30.0 | 30.0 |
| MgO | 20.0 | 20.0 | 25.9 | 17.5 | 15.0 | 17.5 | 20.0 | 16.2 |
| $Al_2O_3$ | 20.0 | 20.0 | 25.9 | 17.5 | 15.0 | 17.5 | 20.0 | 16.2 |
| Glass Properties | | | | | | | | |
| Fiber Softening Point°C | 840 | 787 | 866 | — | — | — | 803 | 823 |
| Annealing Point°C | 683 | 653 | 725 | 630 | 630 | 649 | 668 | 657 |
| Glass Quality | good | good | good | good | opal | good | good | opal |
| Crystallization Heat Treatment | | | | | | | | |
| °C for 16 Hours | 860 | 700 | 760 | 700 | 700 | 700 | 700 | 700 |
| + | | | | | | | | |
| °C for 1 Hour | 1100 | 1000 | 1150 | 1100 | 1040 | 1040 | 1100 | 1100 |
| Sag Test Deflection in mm at °C for ½ hour | | | | | | | | |
| 1000 | 0 | 0.3 | 0 | 0 | 0.2 | 0.2 | 0.2 | 0.5 |
| 1100 | 0 | >3 | 0 | >3 | >3 | > 3 | >3 | >3 |
| 1200 | 0.2 | >3 | >3 | — | — | — | — | — |
| 1250 | >3 | >3 | >3 | — | — | — | — | — |
| Sheet Resistivity (Ω/□) after "P" doping at ½ hour at 20 C | | | | | | | | |
| 1000 | 55 | 28 | — | 31 | 175 | 28 | 28 | 27 |
| 1100 | — | — | 41 | — | — | — | — | — |
| 1200 | 2 | — | — | — | — | — | — | — |

Having thus described the invention, what is claimed is:

1. In the process for doping a semiconductor, wherein a semiconductor and a solid dopant host for vapor phase transport of $B_2O_3$ are maintained in vapor phase communication at a temperature and for a time sufficient to form a zone of P type conductivity in said semiconductor, the improvement wherein said solid dopant host comprises a glass-ceramic body consisting essentially of:

| Component | Mole % |
|---|---|
| $SiO_2$ | 2–50 |
| $Al_2O_3$ | 15–36 |
| $B_2O_3$ | 10–50 |
| MgO | 15–36 |

said body being substantially free of alkali metal oxides, and said body being rigid and dimensionally stable during the doping period.

2. The process of claim 1 wherein said glass-ceramic body consists essentially of:

| Component | Mole % |
|---|---|
| $SiO_2$ | 5–30 |
| $Al_2O_3$ | 20–30 |
| $B_2O_3$ | 25–50 |
| MgO | 20–36 |

3. The process of claim 1 wherein said semiconductor is an N type silicon semiconductor.

4. The process of claim 3 wherein said silicon semiconductor is contacted with an atmosphere consisting essentially of $B_2O_3$ vapors and a carrier gas for said $B_2O_3$ vapors.

5. The process of claim 3 wherein said temperature is in the range of about 700°C to about 1200°C.

6. The method of claim 5 wherein said temperature is in the range of 850°C to about 1100°C.

7. The process for diffusing boron into a silicon semiconductor comprising the steps of:

positioning at least one silicon semiconductor in a heating chamber; positioning a glass-ceramic dopant host consisting essentially of:

| Component | Mole % |
|---|---|
| $SiO_2$ | 2–50 |
| $Al_2O_3$ | 15–36 |
| $B_2O_3$ | 10–50 |
| MgO | 15–36 |

said host being substantially free of alkali metal oxides in said heating chamber, said dopant host being in vapor phase communication with, but not in physical contact with, said silicon semiconductor;

subjecting said silicon semiconductor and said glass-ceramic dopant host to a temperature in the range of 700°C. to about 1200°C. for a time sufficient to liberate $B_2O_3$ vapors from said glass-ceramic dopant host;

contacting $B_2O_3$ vapors with at least a portion of the surface of said semiconductor for a period of time sufficient to permit diffusion of boron into the surface of said silicon semiconductor to form a boron-enriched zone therein.

8. The process of claim 7 wherein said silicon semiconductor is an N type semiconductor.

9. The process of claim 8 wherein said silicon semiconductor and said glass-ceramic dopant host are in the form of wafers.

10. The process of claim 9 wherein a plurality of silicon semiconductor wafers and a plurality of glass-ceramic dopant wafers are alternately positioned with the planar wafer surfaces being substantially parallel and in spaced, confronting relationship.

11. The process of claim 9 wherein a pair of said semiconductor wafers in back-to-back contact are alternately positioned in substantially parallel, spaced, confronting relationship with planar surfaces of said dopant wafers.

12. In the process for forming a P-N junction in an N type silicon semiconductor, wherein an N type semiconductor and a solid dopant host for vapor phase transport of boron are maintained in vapor phase communication at a temperature and for a time sufficient to form said P-N junction, the improvement wherein said solid dopant host comprises a glass-ceramic body consisting essentially of:

| Component | Mole % |
|---|---|
| $SiO_2$ | 2–50 |
| $Al_2O_3$ | 15–36 |
| $B_2O_3$ | 10–50 |
| MgO | 15–36 |

said body being substantially free of alkali metal oxides, and said body being rigid and dimensionally stable during the period of formation of said P-N junction.

* * * * *

UNITED STATES PATENT OFFICE
CERTIFICATE OF CORRECTION

Patent No. 3,928,096 Dated December 23, 1975

Inventor(s) Peter J. Vergano and William E. Smith

It is certified that error appears in the above-identified patent and that said Letters Patent are hereby corrected as shown below:

Column 13, line 27 should read "at °C"

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*